United States Patent
Hsu

(10) Patent No.: US 7,271,618 B2
(45) Date of Patent: Sep. 18, 2007

(54) MULTIPLE-TIME PROGRAMMING APPARATUS AND METHOD USING ONE-TIME PROGRAMMING ELEMENT

(75) Inventor: Shih-Pin Hsu, Tainan (TW)

(73) Assignee: Novatek Microelectronics Corp., Hsinchu (TW)

( * ) Notice: Subject to any disclaimer, the term of this patent is extended or adjusted under 35 U.S.C. 154(b) by 69 days.

(21) Appl. No.: 10/908,822

(22) Filed: May 27, 2005

(65) Prior Publication Data

US 2005/0275426 A1 Dec. 15, 2005

(30) Foreign Application Priority Data

May 27, 2004 (TW) ................................ 93115036 A

(51) Int. Cl.
*H03K 19/173* (2006.01)
(52) U.S. Cl. .......................................... 326/38; 326/41
(58) Field of Classification Search ............ 326/37–41, 326/47
See application file for complete search history.

(56) References Cited

U.S. PATENT DOCUMENTS 4,847,612 A * 7/1989 Kaplinsky .................... 326/10
4,872,137 A * 10/1989 Jennings, III ................ 377/73
6,747,478 B2 * 6/2004 Madurawe ................... 326/39

* cited by examiner

*Primary Examiner*—James H. Cho
(74) *Attorney, Agent, or Firm*—Jianq Chyun IP Office

(57) ABSTRACT

A multiple-time programming apparatus and method using one-time programming (OTP) elements are provided. The apparatus comprises a first adjusting OTP element, a second adjusting OTP element and a logic device. An adjusting data is written into the first adjusting OTP element. When a modification in an IC is desired, the value of a desired data and the prior adjusting data is performed exclusive-OR (XOR, hereinafter) together and written into the second adjusting OTP element. The logic device performs XOR on the first OTP signal outputted from the first adjusting OTP element and the second OTP signal outputted from second adjusting OTP element, and outputs the resulting OTP signal with desired value. Thus, the apparatus and the method according to an embodiment of the present invention allow modification of data using the OTP elements that prevents from using expensive multiple-time programming elements.

8 Claims, 2 Drawing Sheets

US 7,271,618 B2

MULTIPLE-TIME PROGRAMMING APPARATUS AND METHOD USING ONE-TIME PROGRAMMING ELEMENT

CROSS-REFERENCE TO RELATED APPLICATION

This application claims the priority benefit of Taiwan application serial no. 93115036, filed on May 27, 2004. All disclosure of the Taiwan application is incorporated herein by reference.

BACKGROUND OF THE INVENTION

1. Field of the Invention

The present invention relates to an integrated circuit (IC, hereinafter). More particularly, the present invention relates to a multiple-time programming apparatus and a method using one-time programming elements.

2. Description of Related Art

In a proceeding of an integrated circuit manufacture, the electrical parameters of each integrated circuit may vary from lot to lot, and vary from wafer to wafer of the same lot, and even vary from die to die of the same wafer. There are different process variations such as deviation of ion implantation, deviation of gate oxide thickness, and error in etching. Such variation of process will cause frequency deviation of an oscillator, or voltage deviation of a regulator. If the electrical parameters of an integrated circuit vary beyond the specification, e.g. over 5% deviation of the IC specification, the IC is identified as defective during testing process. Therefore, the IC manufacturers usually perform some post-fabrication fine-tuning of the parameters mentioned above in order to increase IC production yield. Since the aforementioned parameters always change along with the variation of process parameters, one-time programming (OTP, hereinafter) elements, e.g. fuse or metal wire, are used usually for fine-tuning to keep consistency of an output lot. Generally speaking, the methods of fine-tuning an IC at ex-factory effectively increase the production yield.

Common OTP adjusting methods for integrated circuit includes laser trim and poly fuse, also known as E-fuse. The OTP element used in laser trim is a metal wire, and it is programmed by blowing the metal wire with high energy laser. The OTP element used in poly fuse is a poly wire (a.k.a. poly fuse), and it is programmed by blowing the poly wire with a large current or by changing the resistance of the poly wire through the electron migration caused by a large current. To find out whether an OTP element is programmed, the metal wire or ploy wire is detected for open circuit or change of resistance by reading the circuit. The aforementioned programming process is irreversible, i.e. the element cannot be reprogrammed once it is programmed.

In using an OTP element, e.g. a poly fuse, the element cannot be programmed again once it is programmed (blowed), hence the parameter can not be re-adjusted, i.e. it is not multiple-time programmable. However, from the users prospective, it is desired that the parameters can be re-programmed or modified several times even after they are programmed by IC manufacturer at ex-factory. Take STN LCD driver ICs for example, although the operating voltage VLCD of STN LCD driving waveform is adjusted to an accurate value at ex-factory of the IC. However in the STN LCD module factory, the variation in characteristics of liquid crystal formula and deviation of cell gap may cause the contrast ratio deviation of the STN LCD module, which makes it a defective product. In such case, it is desired for the STN LCD module factory that the operating voltage VLCD of STN driver can be fine-tuned again to increase the production yield of STN LCD module.

Therefore, in the prior art, Multiple-Time Programming (MTP, hereinafter) elements, e.g. Erasable Programmable Read-Only-Memory (EPROM, hereinafter), Electrically Erasable Programmable Read-Only-Memory (EEPROM, hereinafter), and FLASH memory are adopted to perform multiple-time programming. However, MTP elements are unfavorable because of more expensive process, for example, a common STN LCD driver IC is manufactured with a 0.35 μm 3.3V/18V high voltage process. Adding a MTP element such as an EEPROM into the IC requires several additional masks, thereby increasing the manufacturing cost. The additional masks also reflect to longer manufacturing time and delivery lead-time, and lower production yield. Furthermore, fewer foundries are equipped with technologies for implementing the process fabricating MTP elements. Adopting MTP elements makes it difficult to find more appropriate subcontract foundries, hence endanger the productivity dispersion.

SUMMARY OF THE INVENTION

Accordingly, the present invention is directed to a multiple-time programming apparatus using OTP elements. Logic devices are utilized to perform exclusive-OR (XOR, hereinafter) on the OTP signals outputted from a plurality of adjusting OTP elements, the apparatus allows desired adjustment of parameters that can be written separately to output different signals. Thus, the disadvantages of prior art, where programming process is irreversible or the OTP element cannot be reprogrammed once it is programmed, can be effectively resolved.

The present invention is also directed to a multiple-time programming method using OTP elements. According to an embodiment of the present invention, the OTP signals outputted from a plurality of adjusting OTP elements are performed XOR together to output a signal with a desired specification or characteristics. Accordingly, the method according to an embodiment of the invention allows desired adjustment of parameters that can be written separately to output different signals. Thus, the disadvantages of prior art where programming process is irreversible or the OTP element cannot be reprogrammed once it is programmed can be effectively resolved.

According to an embodiment of the present invention, the apparatus comprises a first adjusting OTP element for outputting a first OTP signal, a second adjusting OTP element for outputting a second OTP signal and a logic device. Wherein the logic device is coupled to the first adjusting OTP element and the second adjusting OTP element. The logic device performs XOR on the values of the first OTP signal and the second OTP signal and output a signal with a value equivalent to the XOR values of the first OTP signal and the second OTP signal.

According to another embodiment of the present invention, the apparatus comprises N+1 groups of adjusting OTP elements and N logic devices. For example, the N+1 groups of adjusting OTP elements comprises a first group, a second group . . . and N+1$^{th}$ group of adjusting OTP elements, and the N logic devices may comprise a first, a second . . . and the N$^{th}$ logic device, where N is an integer greater than 1. Every adjusting OTP element is capable of outputting an OTP signal and every logic device is capable of outputting an adjusting signal. The Nth logic device is coupled to the N+1$^{th}$ group of adjusting OTP elements and the N−1$^{th}$ logic device, whereby the value of the OTP signal from the N+1$^{th}$ group of adjusting OTP elements and the value of the adjusting signal from the N−1$^{th}$ logic device can be performed XOR together to output signals with values equivalent to the XOR values of the OTP signal from the N+1$^{th}$ group of adjusting OTP elements and the adjusting signal from the N−1$^{th}$ logic device. The first logic device is coupled to the first group of adjusting OTP elements and the second group of adjusting OTP elements, whereby the values of OTP signals from the first group adjusting of OTP elements and the second group of adjusting OTP elements can be performed XOR together to output signals with values equivalent to the XOR values of OTP signals from the first group adjusting of OTP elements and the second group of adjusting OTP elements.

According to an embodiment of the present invention, the apparatus further comprises writing devices coupled to the adjusting OTP elements such that the adjusting data can be written into each adjusting OTP element separately.

According to another embodiment of the present invention, a multiple-time programming method using OTP elements is provided. First, N+1 groups of adjusting OTP elements, for example, a first group, a second, . . . and a N+1$^{th}$ group of adjusting OTP elements, are provided, wherein N is an integer greater than 1. Each adjusting OTP element is capable of outputting an OTP signal. Next, values of OTP signals from the first group of adjusting OTP elements and the second group of adjusting OTP elements are performed XOR to output a first adjusting signal. Likewise, the values of signals from different groups of OTP elements among the N+1$^{th}$ group of adjusting OTP element and the N−1$^{th}$ adjusting signal are performed XOR respectively to output an N$^{th}$ adjusting signal.

According to an embodiment of the present invention, aforementioned method further comprises writing a plurality of adjusting data into adjusting OTP elements to output a desired OTP signal. Since the N$^{th}$ adjusting signal is an XOR result of all the OTP signals from the first thru the N+1$^{th}$ group of adjusting OTP elements, therefore it is possible to modify the value of the N$^{th}$ adjusting signal multiple number of times by writing adjusting data into every adjusting OTP element accordingly. Accordingly, multiple-time programming can be achieved.

According to an embodiment of the present invention, the OTP element can be a metal wire or a poly fuse, wherein the metal wire can be adjusted with a laser and the poly fuse can be adjusted with an electric current. Furthermore, the OTP element can be an element programmable for at least one time as well, e.g. EPROM, EEPROM or Flash Memory. However, the scope of the present invention is not limited to the aforementioned devices.

The multiple-time programming apparatus and method using OTP element according to an embodiment of the present invention can achieve functions similar to that of expensive MTP elements, and therefore the cost can be effectively reduced. In other words, the apparatus comprising OTP elements according to the present embodiment of the present invention serves as an MTP element. Meanwhile, the process of fabricating the apparatus according to the present embodiment of the present invention do not require special process and is applicable to most foundries and their manufacturing processes, and the overall production cost can be effectively reduced.

In order to the make the aforementioned and other objects, features and advantages of the present invention comprehensible, an embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
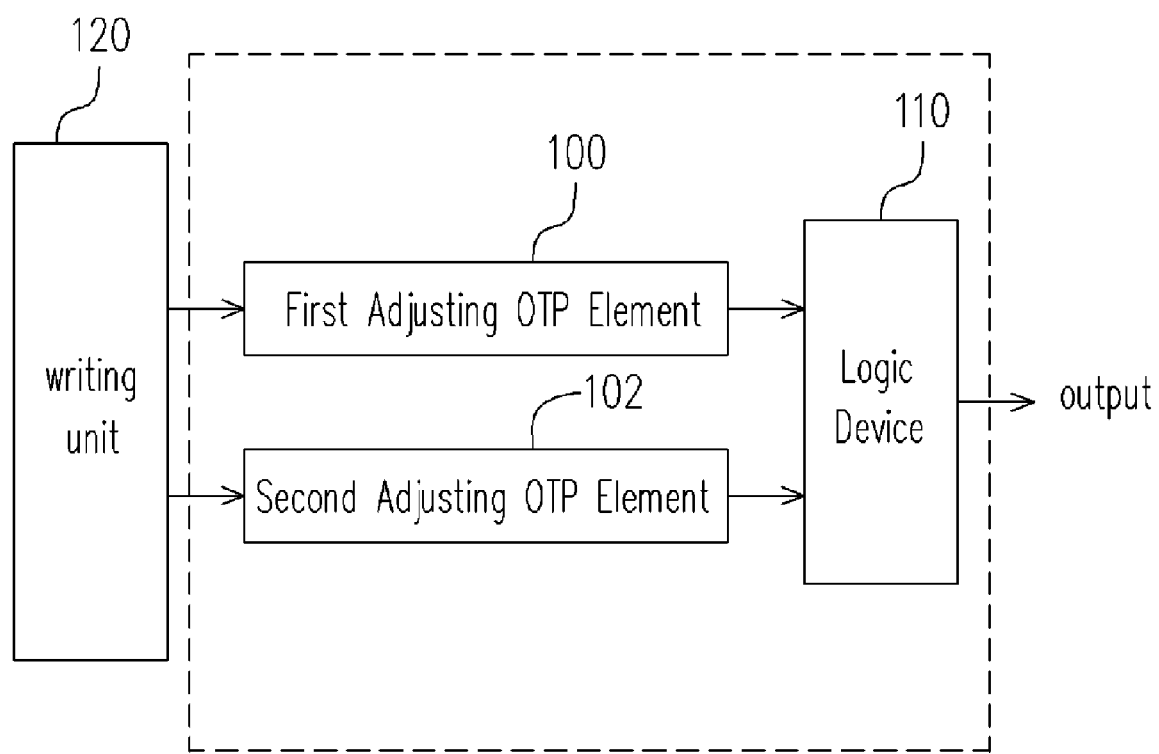
FIG. 1 is a schematic block diagram for an apparatus for two-time programming using OTP elements according to an embodiment of the present invention.

Referring to FIG. 1, a schematic block diagram for an apparatus for two-time programming using OTP elements according to an embodiment of the present invention is shown.

As shown in FIG. 1, the apparatus includes a logic device 110 coupled to a first adjusting OTP element 100 and a second adjusting OTP element 102. The apparatus further includes a writing device 120 coupled to the first adjusting OTP element 100 and the second adjusting OTP element 102.

According to an embodiment of the present invention, the first OTP signal and the second OTP signal are performed XOR together by the logic device 110 so that an adjusting signal with a value equivalent to the XOR values of the first OTP signal and the second OTP signal can be output. Wherein the first OTP signal is outputted from the first adjusting OTP element 100 and the second OTP signal is outputted from the second adjusting OTP element 102. Since no adjusting data was written into the first adjusting OTP element 100 or the second adjusting OTP element 102, the initial values are 0 for both the first and the second OTP signals. Hence the value of the adjusting signal outputted from the logic device 110 is also 0.

When modifying the IC for the first time, the writing device 120 writes a first adjusting data into the first adjusting OTP element 100 only. The logic device 110 performs XOR on the values of the first and second OTP signals to output an adjusting signal with the first adjusting data because and the value of the second OTP signal is 0 since no adjusting data was written therein.

Thereafter, when it is required to further modify the IC output signal or desired to rewrite a new adjusting data, the values of the desired signal and the first adjusting signal are performed XOR together for obtaining the second adjusting data. This second adjusting data is then written into the second adjusting OTP element 102 by the writing device 120. Next, the logic device performs XOR on the values of the first OTP signal and the second OTP signal to output a desired second adjusting signal.

For example, the value of the first adjusting signal is 0001 and the value of desired second adjusting signal is 0010. Thus, the value of second adjusting data is 0001⊕0010=0011 and the value outputted from the logic device is 0001⊕0011=0010, which is the desired second adjusting signal.

Similarly, according to the aforementioned embodiment, when it is desired to write adjusting data for N number of times (N is an integer greater than 1), i.e. multiple-time programming, N+1 groups of adjusting OTP elements are used.

Figure 2:
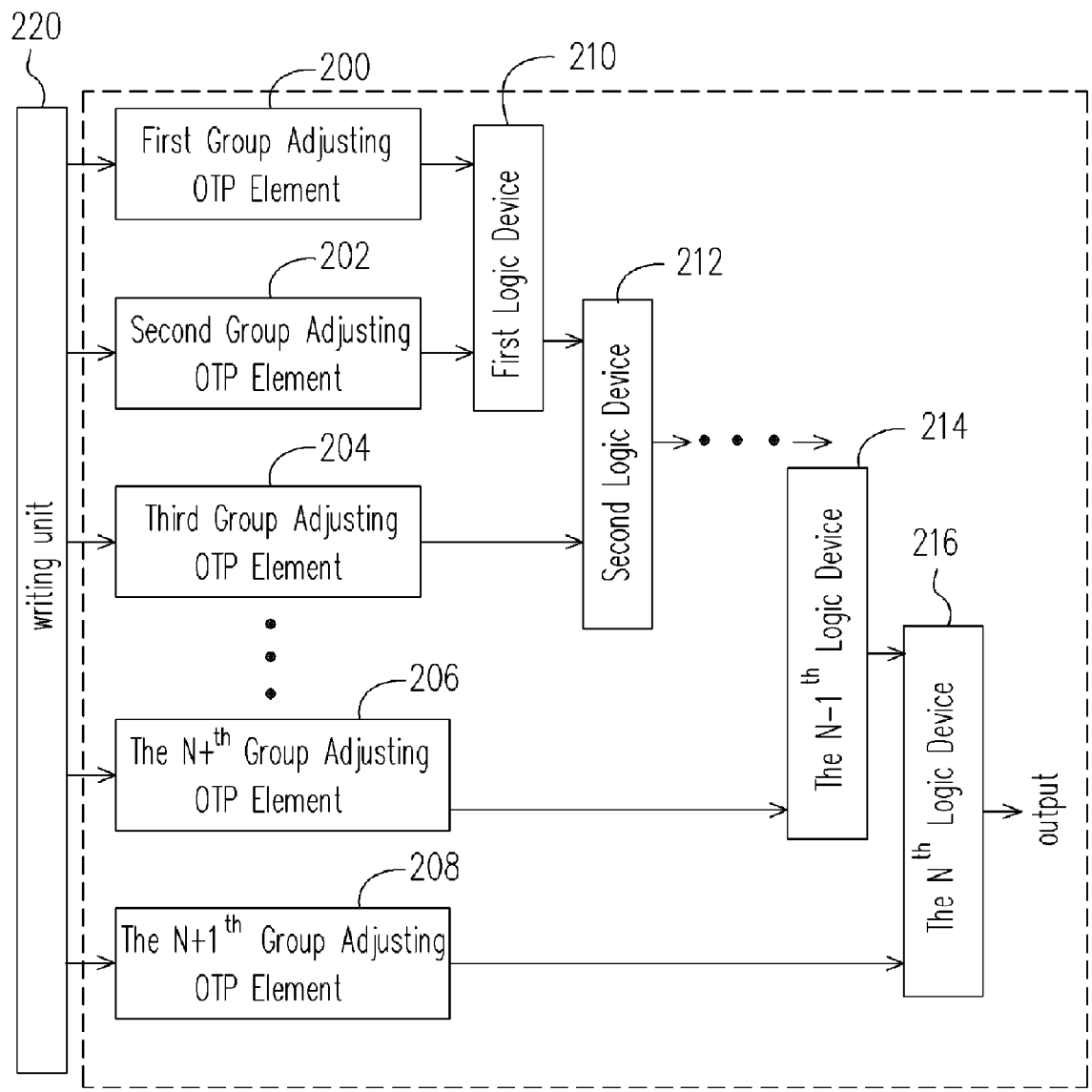
FIG. 2 is a schematic block diagram for an apparatus for multiple-time programming using OTP elements according to an embodiment of the present invention.

Referring to FIG. 2, N+1 groups of adjusting OTP elements 200~208 and N logic devices 210~216 are provided. The N+1 groups of adjusting OTP elements 200~208 may comprise a first group of adjusting OTP element 200, a second group of adjusting OTP element 202 . . . and a N+1$^{th}$ group of adjusting OTP element 208; and the N logic devices may comprise a first logic device 210, a second logic device 211 . . . and a Nth logic device 216.

Wherein, the first logic device 210 is coupled to the first group of adjusting OTP element 200 and the second group of adjusting OTP element 202; the N$^{th}$ logic device 216 is coupled to the N+1$^{th}$ group of adjusting OTP element 208 and the N–1$^{th}$ logic device 214. The first logic device 210 performs XOR on the values of the OTP signals from the first group of adjusting OTP element 200 and the second group of adjusting OTP element 202 to output an adjusting signal with a value equivalent to the XOR values of signals from first group of adjusting OTP element 200 and the second group of adjusting OTP element 202. The N$^{th}$ logic device 216 performs XOR on the values of the OTP signal from the N+1$^{th}$ group of adjusting OTP element 208 and the adjusting signal from the N–1$^{th}$ logic device 214 to output an adjusting signal with a value equivalent to the XOR values of the OTP signal from the N+1$^{th}$ group of adjusting OTP element 208 and the adjusting signal from the N–1$^{th}$ logic device 214.

It is understood from above descriptions, the final output signal=the first OTP signal$\oplus$the second OTP signal$\oplus$ . . . $\oplus$the N+1$^{th}$ OTP signal.

Accordingly, in the present embodiment, when the IC is modified for the first time, the writing device 220 writes the first adjusting data into the first adjusting OTP element 200 only to output the first OTP signal with first adjusting data. According to aforementioned circuit design rule of the present invention, the final output signal=the first OTP signal$\oplus$the second OTP signal$\oplus$ . . . $\oplus$the N+1$^{th}$ OTP signal, wherein the second OTP signal=the third OTP signal= . . . =the N+1$^{th}$ OTP signal=0. Therefore the final output=the first OTP signal.

Thereafter, when it is desired to modify the output signal or write a new adjusting data for outputting a desired output signal, the values of the desired signal and the first adjusting signal are performed XOR together for obtaining the second adjusting data. The second adjusting data is then written into the second adjusting OTP element 202 using the writing device 220. According to aforementioned circuit design rule of the present invention, the final output signal=the first OTP signal$\oplus$the second OTP signal$\oplus$ . . . $\oplus$the N+1$^{th}$ OTP signal, wherein the third OTP signal=the fourth OTP signal= . . . =the N+1$^{th}$ OTP signal=0 except for the first and the second OTP signal. Therefore the final output signal=the first OTP signal$\oplus$the second OTP signal.

Accordingly, the modification of the output signal or the writing of adjusting data into adjusting OTP elements can be implemented by performing XOR on adjusting data written in the adjusting OTP elements to generate a desired adjusting signal. Thus, N groups of adjusting OTP elements provides N times programming capability.

The present invention is also directed to a multiple-time programming method using OTP elements. The multiple-time programming method may be implemented by using the aforementioned apparatus and can be described as follows.

First, N+1 groups of adjusting OTP element 200~208 capable of outputting OTP signals are provided. Next, XOR is performed on the values of the OTP signals from the first group of adjusting OTP element 200 and the second group of adjusting OTP element 202 to output a first adjusting signal. Subsequently, XOR is performed on the values of the first adjusting signal and the OTP signals from the third group of adjusting OTP element 204 to output a second adjusting signal. Likewise, the process of XOR is continued until the values of the N–1$^{th}$ adjusting signal and the OTP signals from the N+1$^{th}$ group of adjusting OTP element 208 are performed XOR together to output the final signal.

It is understood from above descriptions, the final output signal=the first OTP signal$\oplus$the second OTP signal$\oplus$ . . . $\oplus$the N+1$^{th}$ OTP signal.

When modification to the IC is desired for the first time, the writing device 220 is used to write the first adjusting data into the first adjusting OTP element 200 only. According to aforementioned circuit design rule of the present invention, the final output signal=the first OTP signal$\oplus$the second OTP signal$\oplus$ . . . $\oplus$the N+1$^{th}$ OTP signal, wherein the second OTP signal=the third OTP signal= . . . =the N+1$^{th}$ OTP signal=0. Therefore, the final output=the first OTP signal.

Thereafter, when further modification to the IC is desired to output a desired output signal or write a new adjusting data in the adjusting OTP element for modifying the output signal, XOR is performed on the values of the desired signal and the first adjusting signal for obtaining the second adjusting data. The second adjusting data is then written into the second adjusting OTP element 202 using the writing device 220. According to aforementioned circuit design rule of the present invention, the final output signal=the first OTP signal$\oplus$the second OTP signal$\oplus$ . . . $\oplus$the N+1$^{th}$ OTP signal, wherein the third OTP signal=the fourth OTP signal= . . . =the N+1$^{th}$ OTP signal=0 except for the first and the second OTP signal. Therefore the final output signal=the first OTP signal$\oplus$the second OTP signal=desired output signal.

Accordingly, the modification of the output signal or the writing of adjusting data into adjusting OTP elements can be implemented by performing XOR on adjusting data written in the adjusting OTP elements to generate a desired adjusting signal.

Accordingly, N groups of adjusting OTP elements provides N times programming capability. From users' aspect, by the aforementioned apparatus and method thereof for multiple-time programming using OTP elements, different output values is obtained according to different adjusting data written into each adjusting OTP element. Therefore, it allows rewriting of the adjusting data and serves as an MTP element. Furthermore, the manufacturing process of OTP elements is simpler than that of MTP elements, thus allow lower production cost and more choice of capable foundries.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multiple-time programming apparatus using one-time programming (OTP) elements, comprising:

N+1 groups of adjusting OTP elements, comprising a first group of adjusting OTP elements, a second group of adjusting OTP elements . . . and a N+1$^{th}$ group of adjusting OTP elements, wherein N is an integer greater than 1, wherein each of the adjusting OTP elements outputs an OTP signal; and N logic devices, comprising a first logic device, a second logic device . . . and a N$^{th}$ logic device, wherein N is an integer greater than 1, wherein each of the logic devices outputs an adjusting signal, wherein the N$^{th}$ logic device is coupled to the N+1$^{th}$ group of adjusting OTP elements and the N−1$^{th}$ logic device, for performing XOR on an OTP signal outputted from the N+1$^{th}$ group of adjusting OTP elements and an adjusting signal outputted from the N−1$^{th}$ logic device, and outputting an N$^{th}$ adjusting OTP signal, wherein the first logic device is coupled to the first group of adjusting OTP elements and the second group of adjusting OTP elements for logic a first OTP signal and a second OTP signal outputted from the first group adjusting OTP elements and second group of adjusting OTP elements respectively and outputting a first adjusting OTP signal.

2. The multiple-time programming apparatus using OTP elements as recited in claim 1, further comprising a writing device coupled to the N+1 groups of adjusting OTP elements for writing a plurality of ajusting data into N+1 groups of adjusting OTP elements.

3. The multiple-time programming apparatus using OTP elements as recited in claim 1, wherein the N+1 groups of adjusting OTP elements comprise a plurality of poly fuses.

4. The multiple-time programming apparatus using OTP elements as recited in claim 1, wherein the N+1 groups of adjusting OTP elements comprise a plurality of metal adjustable with laser.

5. The multiple-time programming apparatus using OTP elements as recited in claim 1, wherein The N+1 groups of adjusting OTP elements comprise elements programmable for at least one time.

6. The multiple-time programming apparatus using OTP elements as recited in claim 1, wherein the N+1 groups of adjusting OTP elements comprise elements selected from a group consisting an EPROM, an EEPROM and a FLASH memory.

7. The multiple-time programming apparatus using OTP elements as recited in claim 1, wherein the logic devices comprise a plurality of XOR elements or XNOR elements.

8. A multiple-time progranunlng method using OTP elements, comprising:

providing N+1 groups of adjusting OTP elements, comprising a first group of adjusting OTP elements, a second group of adjusting OTP elements . . . and an N+1$^{th}$ group of adjusting OTP elements, wherein N is an integer greater than 1, and wherein each of the adjusting OTP elements outputs an OTP signal;

performing a logic operation on the OTP signals outputted from the first group of adjusting OTP elements and the second group of adjusting OTP elements, and outputting a first adjusting signal; and performing the logic operation on the OTP signal outputted from the N+1$^{th}$ group of adjusting OTP elements and an N−1$^{th}$ adjusting signal for outputting an N$^{th}$ adjusting signal, wherein the logic operaflon comprises a plurality of XOR operations or XNOR operations.

* * * * *